United States Patent
Fukuda et al.

(10) Patent No.: US 7,479,190 B2
(45) Date of Patent: Jan. 20, 2009

(54) COATING TREATMENT APPARATUS AND COATING TREATMENT METHOD

(75) Inventors: Yoshiteru Fukuda, Koshi-machi (JP); Tomohiro Iseki, Koshi-machi (JP); Takayuki Ishii, Koshi-machi (JP)

(73) Assignee: Tokyo Electron Limited, Tokyo (JP)

( * ) Notice: Subject to any disclaimer, the term of this patent is extended or adjusted under 35 U.S.C. 154(b) by 414 days.

(21) Appl. No.: 11/232,241

(22) Filed: Sep. 22, 2005

(65) Prior Publication Data

US 2006/0068110 A1  Mar. 30, 2006

(30) Foreign Application Priority Data

Sep. 24, 2004  (JP)  ............... 2004-277111

(51) Int. Cl.
B05C 11/00 (2006.01)
B05B 7/06 (2006.01)
B05B 3/00 (2006.01)

(52) U.S. Cl. .................. 118/698; 118/688; 118/681; 118/313; 118/323; 118/321

(58) Field of Classification Search .......... 118/313, 118/300, 52, 621, 56, 319, 320, 323, 663, 118/665–668, 695–698, 679–681, 688–690, 118/321; 134/153, 198; 396/604, 611, 627; 427/240, 424, 425, 427.1, 427.2, 427.3

See application file for complete search history.

(56) References Cited

U.S. PATENT DOCUMENTS

| | | | |
|---|---|---|---|
| 5,658,615 A * | 8/1997 | Hasebe et al. ............. 427/240 |
| 5,939,139 A | 8/1999 | Fujimoto |
| 5,997,653 A | 12/1999 | Yamasaka |
| 6,063,190 A | 5/2000 | Hasebe et al. |
| 6,165,552 A | 12/2000 | Anai et al. |
| 6,238,511 B1 | 5/2001 | Sada et al. |
| 6,284,044 B1 * | 9/2001 | Sakamoto et al. ........... 118/219 |
| 6,565,928 B2 | 5/2003 | Sakamoto et al. |
| 2006/0040051 A1 * | 2/2006 | Yamamoto et al. .......... 427/240 |

* cited by examiner

FOREIGN PATENT DOCUMENTS

JP  8-107053  4/1996
JP  2004045491 A  *  2/2004

OTHER PUBLICATIONS

English Translated Abstract JP 2004045491A, Feb. 12, 2004.*

*Primary Examiner*—Yewebdar T Tadesse
(74) *Attorney, Agent, or Firm*—Smith, Gambrell & Russell, LLP

(57) ABSTRACT

In the present invention, a plurality of solvent supply nozzles for solvents having different solubility parameters are provided in a coating treatment apparatus. For a solvent supply nozzle for use at the time of edge rinse, a solvent supply nozzle is selected that discharges a removal solvent having a solubility parameter different by a set value or more from that of a coating solvent contained in a coating solution. During coating treatment, the coating solution is discharged from a coating solution supply nozzle onto the central portion of a rotated substrate to form a solution film having a predetermined film thickness. Immediately after the formation, edge rinse is started with the coating solution on the substrate not dry yet, in which the removal solvent is supplied to the peripheral portion of the substrate from the selected solvent supply nozzle. In this event, the supplied removal solvent repels the coating solution on the substrate, so that only the coating solution on the peripheral portion is appropriately removed. According to the present invention, a series of coating treatments including the edge rinse can be carried out in a shorter time.

11 Claims, 9 Drawing Sheets

FIG.8

CORRESPONDENCE DATA D1

| RESIST SOLUTION SUPPLY NOZZLE | RESIST SOLUTION | COATING SOLVENT |
|---|---|---|
| P1 | R1 | A1 |
| P2 | R2 | A2 |
| P3 | R3 | A3 |
| P4 | R4 | A4 |

FIG.9

SP VALUE DATA D2a

|  | COATING SOLVENT A1 | COATING SOLVENT A2 | COATING SOLVENT A3 | COATING SOLVENT A4 |
|---|---|---|---|---|
| SP VALUE | 18 | 21 | 23 | 20 |

$((J/cm^3)^{\frac{1}{2}})$

FIG.10

SP VALUE DATA D2b

|  | REMOVAL SOLVENT B1 | REMOVAL SOLVENT B2 | REMOVAL SOLVENT B3 | REMOVAL SOLVENT B4 |
|---|---|---|---|---|
| SP VALUE | 26 | 23 | 20 | 19 |

$((J/cm^3)^{\frac{1}{2}})$

FIG.11

CORRESPONDENCE DATA D3

| SOLVENT SUPPLY NOZZLE | REMOVAL SOLVENT |
|---|---|
| S1 | B1 |
| S2 | B2 |
| S3 | B3 |
| S4 | B4 |

COMBINATION DATA D4

|  | REMOVAL SOLVENT B1 | REMOVAL SOLVENT B2 | REMOVAL SOLVENT B3 | REMOVAL SOLVENT B4 |
|---|---|---|---|---|
| COATING SOLVENT A1 | ○ | ○ | × | × |
| COATING SOLVENT A2 | ○ | × | × | × |
| COATING SOLVENT A3 | × | × | × | ○ |
| COATING SOLVENT A4 | ○ | × | × | × |

COATING TREATMENT APPARATUS AND COATING TREATMENT METHOD

BACKGROUND OF THE INVENTION

1. Field of the Invention

The present invention relates to a coating treatment apparatus and a coating treatment method for a substrate.

2. Description of the Related Art

In a photolithography process in a manufacturing process of a semiconductor device, for example, resist coating treatment in which a resist film is formed on a semiconductor wafer (hereinafter, referred to as a "wafer") is performed.

In this resist coating treatment, the wafer is usually held on a spin chuck, and a resist solution is supplied onto the center of the wafer with the wafer being rotated. The resist solution supplied on the center of the wafer is diffused over the entire wafer front surface by centrifugal force to form a solution film of the resist solution on the wafer font surface. Then, a so-called edge rinse is performed to remove the resist solution on a peripheral portion of the wafer (Japanese Patent Application Laid-open No. H8-107053). The edge rinse can prevent generation of particles due to the resist solution on the wafer adhering, for example, to a carrier arm and chucks of other units.

Incidentally, the edge rinse is treatment to selectively remove only the resist solution on the peripheral portion of the wafer as described above. If the edge rinse is carried out for the resist solution on the wafer which has not sufficiently dried yet, the resist solution on the center side of the wafer flows out to the peripheral portion side of the wafer during the edge rinse, failing to carry out sufficient edge rinse on the peripheral portion of the wafer. Therefore, the edge rinse is performed after the solution film of the resist solution is formed on the wafer and sufficiently dries.

However, sufficiently drying of the solution film of the resist solution formed on the wafer front surface requires a great amount of time. Actually, sufficiently drying of the solution film of the resist solution has sometimes required two minutes or more, depending on the kind of the resist solution, even though the wafer has been rotated.

As described above, in the conventional resist coating treatment, drying of the resist solution has required a great amount of time to delay the start of the edge rinse, resulting in increased total time required for the resist coating treatment and leading to reduced throughput. In addition, to increase the efficiency of wafer processing, many resist coating units need to be installed in a coating and developing treatment system in which, for example, a series of photolithography processes is sequentially performed, resulting in a larger coating and developing treatment system.

SUMMARY OF THE INVENTION

The present invention has been developed in consideration of the above points, and its object is to perform a coating treatment such as a resist coating treatment including edge rinse in a shorter time.

To achieve the above object, the present invention is a coating treatment apparatus for applying a coating solution to a front surface of a substrate including: a coating solution supply nozzle for applying the coating solution containing a solvent onto the front surface of the substrate; and a solvent supply nozzle for supplying a solvent to the coating solution on a peripheral portion of the substrate, at the time of edge rinse to remove the coating solution on the peripheral portion of the substrate. A plurality of the solvent supply nozzles are provided which are different in solubility parameter of the solvent to be supplied therefrom. In the present invention, the apparatus further includes a nozzle setting unit for setting a solvent supply nozzle for use at the time of the edge rinse from among the plurality of solvent supply nozzles, based on the solubility parameter of the solvent in the coating solution to be applied by the coating solution supply nozzle and on the solubility parameter of the solvent to be supplied from the solvent supply nozzle.

The nozzle setting unit may set the solvent supply nozzle for use at the time of the edge rinse such that the solubility parameter of the solvent in the coating solution to be applied from the coating solution supply nozzle is different by a predetermined set value or more from the solubility parameter of the solvent to be supplied from the solvent supply nozzle.

The coating treatment apparatus may further include a nozzle moving mechanism for selectively holding the solvent supply nozzle set by the nozzle setting unit from among the plurality of solvent supply nozzles, and moving the holding solvent supply nozzle to a position above the peripheral portion of the substrate. Note that the coating treatment apparatus may further include a plurality of coating solution supply nozzles for different kinds of coating solutions.

According to another aspect, the present invention is a coating treatment method for applying a coating solution to a front surface of a substrate including: a coating step of applying the coating solution containing a solvent onto the front surface of the substrate; and thereafter, a step of supplying a solvent having a solubility parameter different by $3(\text{J}/\text{cm}^3)^{1/2}$ or more from the solubility parameter of the solvent in the coating solution applied during the coating step to the coating solution on a peripheral portion of the substrate to remove the coating solution on the peripheral portion.

According to the present invention, for example, a solvent having a solubility parameter different from that of the solvent in the coating solution of the coating solution supply nozzle can be supplied at the time of edge rinse. Therefore, for example, the coating solution applied on the center side of the substrate front surface and the solvent supplied on the peripheral portion of the substrate refuse dissolution each other and never mix with each other even if the coating solution on the center side of the substrate front surface and the solvent on the peripheral portion of the substrate are placed adjacent to each other. Accordingly, even if the edge rinse is started to supply a solvent to the peripheral portion of the substrate with the coating solution on the substrate front surface not dry yet, only the coating solution on the peripheral portion of the substrate can be appropriately removed. Start of the edge rinse does not need to be delayed until the coating solution dries as described above, the total coating treatment time including the edge rinse can be reduced. Consequently, the throughput can be improved.

BRIEF DESCRIPTION OF THE DRAWINGS

FIG. 8 is an explanatory diagram showing correspondence data between resist solution supply nozzles, resist solutions, and coating solvents;

FIG. 9 is an explanatory diagram showing SP value data showing the SP value for each coating solvent;

FIG. 10 is an explanatory diagram showing SP value data showing the SP value for each removal solvent;

FIG. 11 is an explanatory diagram showing correspondence data between the solvent supply nozzle and the removal solvent;

DETAILED DESCRIPTION OF THE INVENTION

Figure 1:
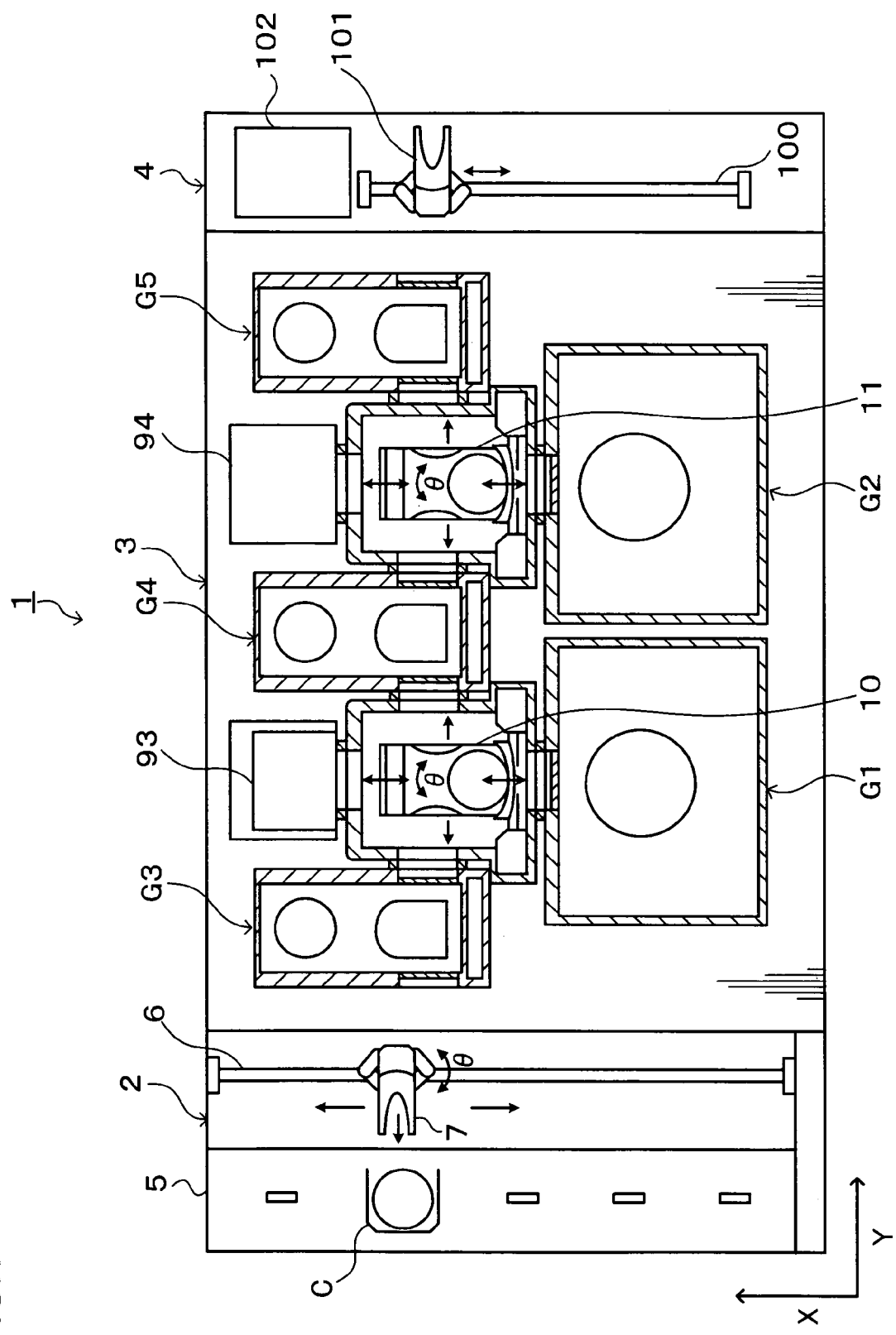
FIG. 1 is a plan view showing the outline of a configuration of a coating and developing treatment system incorporating a coating treatment apparatus according to this embodiment.
Figure 2:
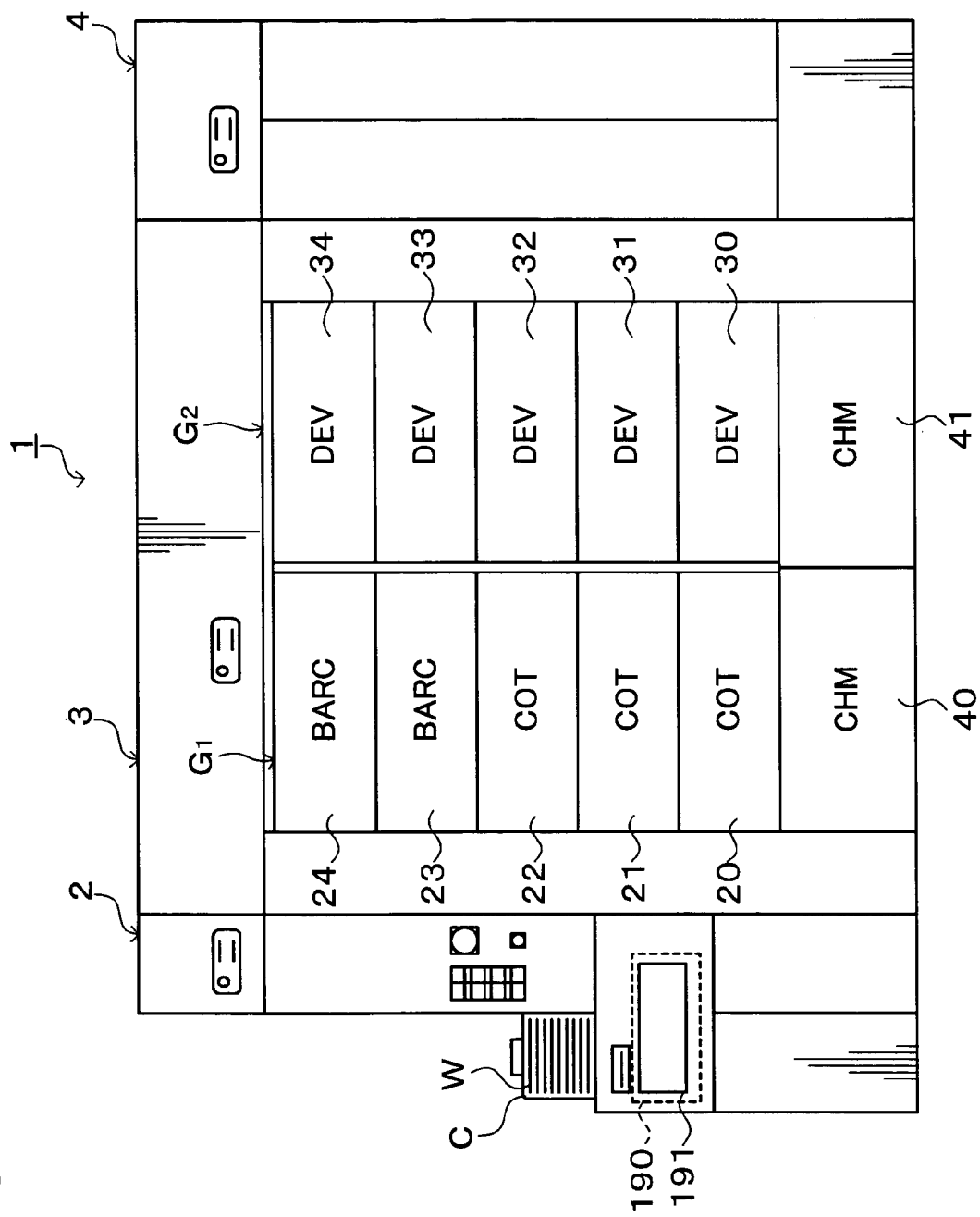
FIG. 2 is a front view of the coating and developing treatment system in FIG. 1.
Figure 3:
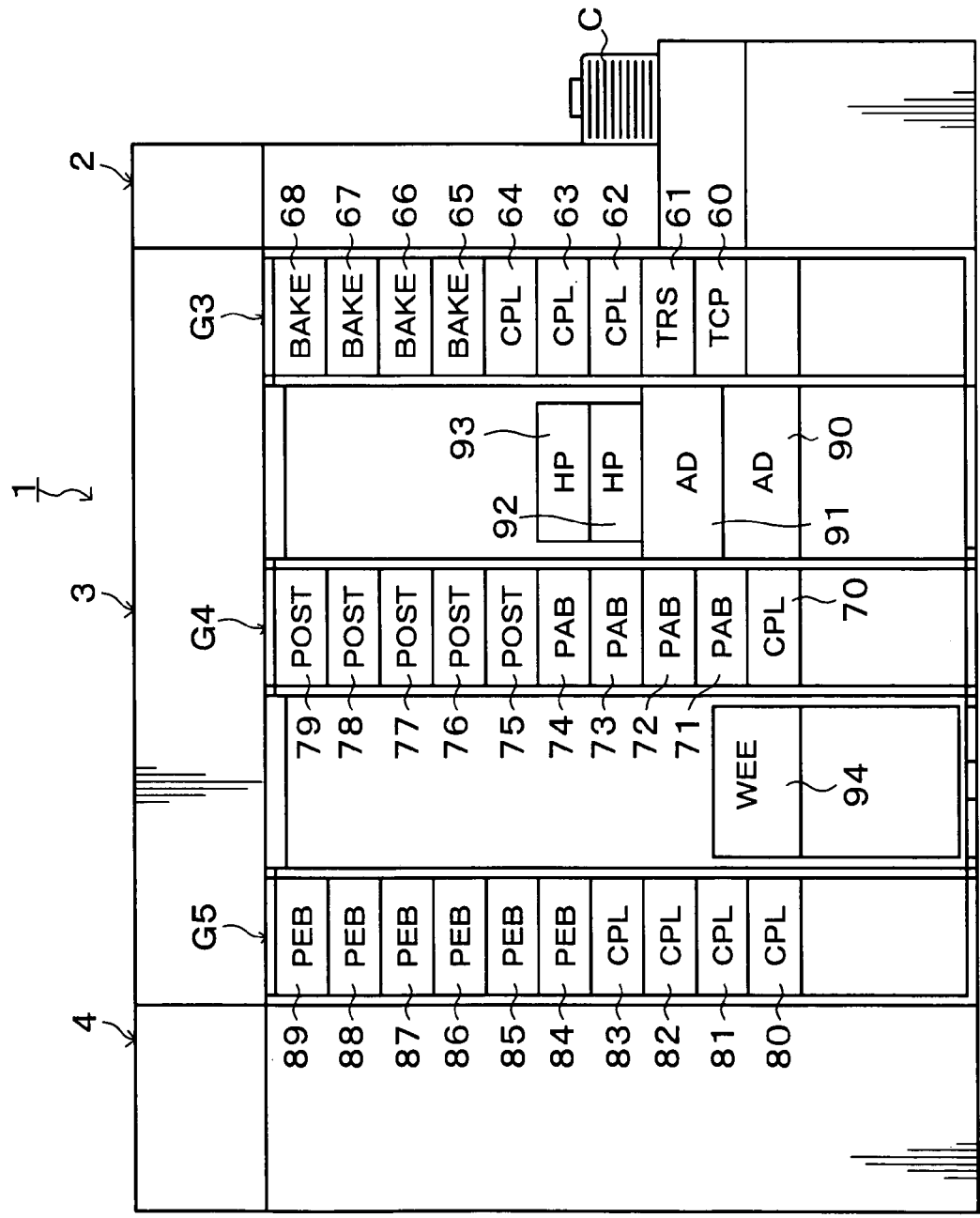
FIG. 3 is a rear view of the coating and developing treatment system in FIG. 1.

Hereinafter, the present invention will be described in detail based on a preferred embodiment of the present invention. FIG. 1 is a plan view showing the outline of a configuration of a coating and developing treatment system 1 incorporating a coating treatment apparatus according to the embodiment of the present invention, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for carrying, for example, 25 wafers W per cassette as a unit from/to the outside into/from the coating and developing treatment system 1 and carrying the wafers W into/out of a cassette C; a processing station 3 including various kinds of processing and treatment units, which are multi-tiered, for performing predetermined processing or treatments in a manner of single wafer processing in coating and developing treatment processes; and an interface section 4 for transferring the wafers W to/from a not-shown aligner provided adjacent to the processing station 3, are integrally connected together.

In the cassette station 2, a plurality of cassettes C can be mounted at predetermined positions on a cassette mounting table 5 in a line in an X-direction (a top-to-bottom direction in FIG. 1). In the cassette station 2, a wafer carrier 7 which is movable in the X-direction is provided on a carrier path 6. The wafer carrier 7 is also movable in a wafer-arrangement direction of the wafers W housed in the cassette C (a Z-direction; the vertical direction), and thus can selectively access the wafers W in each of the cassettes C arranged in the X-direction.

The wafer carrier 7, which is rotatable in a θ-direction around the Z-axis, can access a later-described temperature regulating unit 60 and a transition unit 61 included in a third processing unit group G3 on the processing station 3 side. Note that the a later-described system controller 190 is disposed in the cassette station 2.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first carrier unit 10 is provided. The first carrier unit 10 can selectively access the processing and treatment units in the first processing unit group G1, the third processing unit group G3, and the fourth processing unit group G4 and carry the wafer W to them. Between the fourth processing unit group G4 and the fifth processing unit group G5, a second carrier unit 11 is provided. The second carrier unit 11 can selectively access the processing and treatment units in the second processing unit group G2, the fourth processing unit group G4, and the fifth processing unit group G5 and carry the wafer W to them.

In the first processing unit group G1, as shown in FIG. 2, solution treatment units each for supplying a predetermined liquid to the wafer W to perform treatment, for example, resist coating units 20, 21, and 22 as the coating treatment apparatuses according to this embodiment and bottom coating units 23 and 24 each for forming an anti-reflection film as a base film that prevents reflection of light during exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62, 63, and 64 each for temperature-regulating the wafer W under temperature control with a high precision, and high-temperature thermal processing units 65, 66, 67, and 68 each for heat-processing the wafer W at a high temperature, are nine-tiered in order from the bottom.

In the fourth processing unit group G4, for example, a high-precision temperature regulating unit 70, pre-baking units 71, 72, 73, and 74 each for heat-processing the wafer W after resist coating treatment, and post-baking units 75, 76, 77, 78, and 79 each for heat-processing the wafer W after developing treatment, are ten-tiered in order from the bottom.

In the fifth processing unit group G5, a plurality of thermal processing units each for performing thermal processing for the wafer W, for example, high-precision temperature regulating units 80, 81, 82, and 83, and post-exposure baking units 84, 85, 86, 87, 88, and 89 each for heat-processing the wafer W after exposure, are ten-tiered in order from the bottom.

As shown in FIG. 1, a plurality of processing and treatment units are arranged on the positive direction side in the X-direction of the first carrier unit 10, for example, adhesion units 90 and 91 each for performing hydrophobic treatment on the wafer W and heating units 92 and 93 each for heating the wafer W being four-tiered in order from the bottom as shown in FIG. 3. As shown in FIG. 1, on the positive direction side in the X-direction of the second carrier unit 11, for example, an edge exposure unit 94 is disposed which selectively exposes only the edge portion of the wafer W to light.

In the interface section 4, for example, a wafer carrier 101 moving on a carrier path 100 extending in the X-direction and a buffer cassette 102 are provided as shown in FIG. 1. The wafer carrier 101 is movable in the Z-direction and also rotatable in the θ-direction and thus can access the not-shown aligner adjacent to the interface section 4, the buffer cassette 102, and the processing and treatment units in the processing unit group G5 and carry the wafer W to them.

Figure 4:
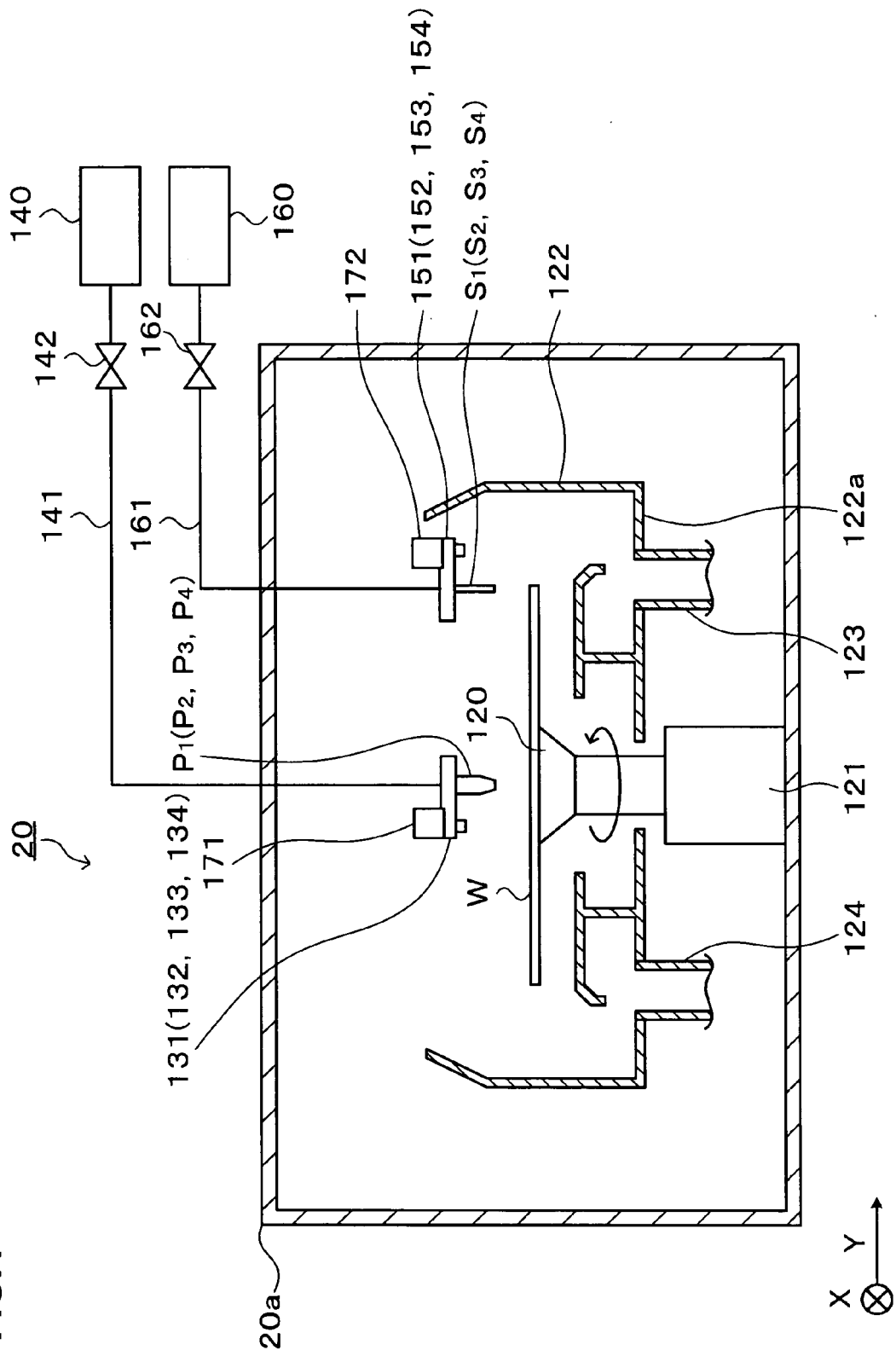
FIG. 4 is an explanatory view of a longitudinal section showing the outline of a configuration of a resist coating unit.
Figure 5:
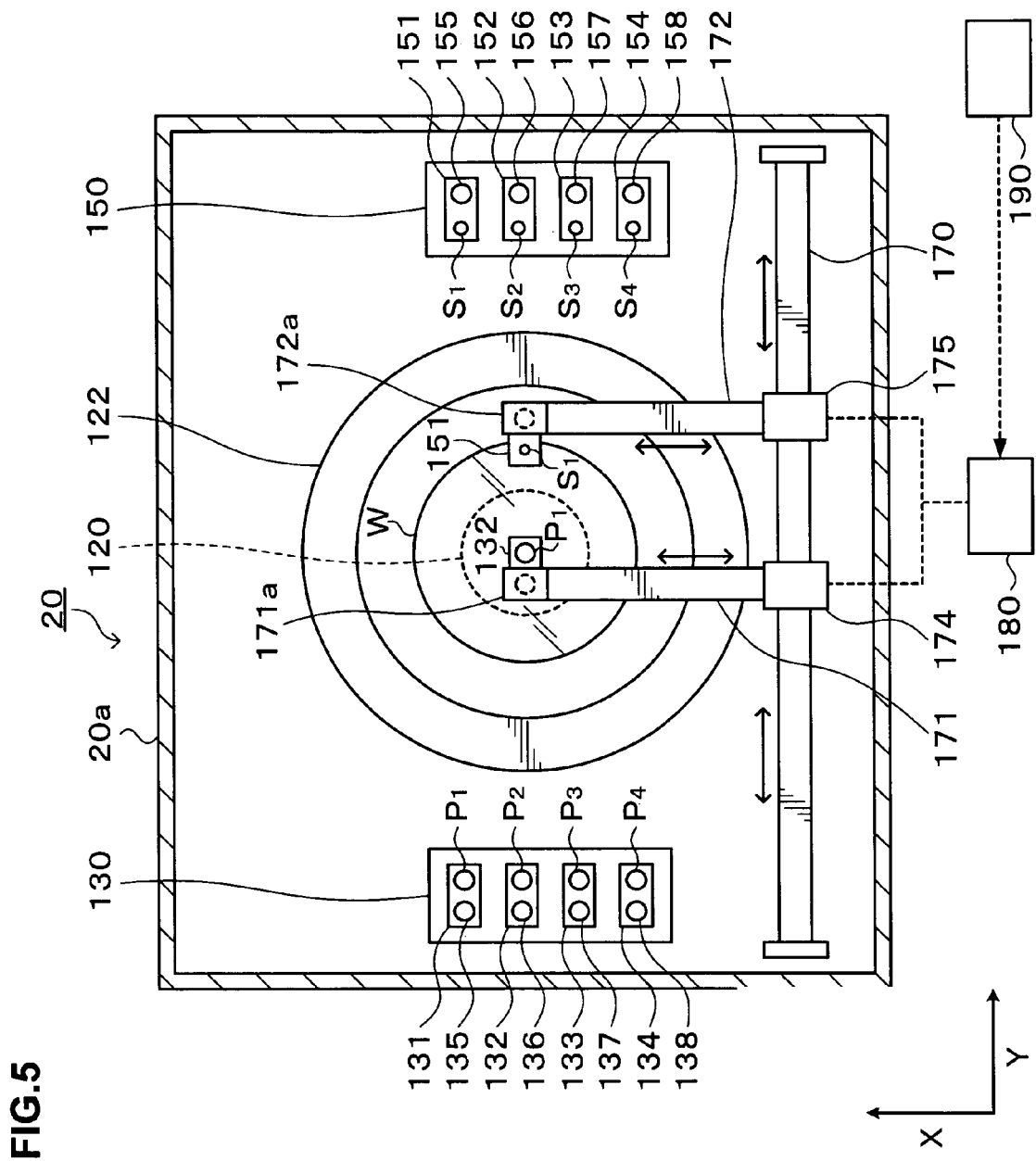
FIG. 5 is an explanatory view of a transverse section showing the outline of the configuration of the resist coating unit.

Next, the configuration of the aforementioned resist coating unit 20 will be described in detail. FIG. 4 is an explanatory view of a longitudinal section showing the outline of a configuration of the resist coating unit 20, and FIG. 5 is an explanatory view of a transverse section showing the outline of the configuration of the resist coating unit 20.

As shown in FIG. 4, the resist coating unit 20 includes a casing 20a in which a spin chuck 120 as a holding member for holding the wafer W thereon is provided at the central portion of the casing 20a. The spin chuck 120 has a horizontal upper surface which is provided with, for example, a suction hole (not shown) for sucking the wafer W. By suction through the suction hole, the wafer W can be sucked onto the spin chuck 120.

The spin chuck 120 is provided with, for example, a chuck drive mechanism 121 for rotating and raising and lowering the spin chuck 120. The chuck drive mechanism 121 includes a rotary drive unit (not shown) such as a motor for rotating the spin chuck 120 at a predetermined speed and a raising/lowering drive unit (not shown) such as a motor or a cylinder for raising and lowering the spin chuck 120. The chuck drive mechanism 121 can raise and lower the wafer W on the spin chuck 120 at a predetermined timing and rotate it at a predetermined speed.

Around the spin chuck 120, for example, a cup 122 is provided for receiving and recovering a resist solution and solvent scattering from the wafer W. The cup 122 is formed to have a substantially cylindrical shape with the top face open and surround the outside and the lower side of the wafer W on the spin chuck 120. The cup 122 is provided with, at its lower surface 122a, a drain pipe 123 for draining the recovered resist solution and the like and an exhaust pipe 124 for exhausting gas in the cup 122.

As shown in FIG. 5, a nozzle accommodation unit 130 is provided, for example, on the side of the negative direction in the Y-direction (the left direction in FIG. 5) of the cup 122. In the nozzle accommodation unit 130, a plurality of, for example, four resist solution supply nozzles $P_1$, $P_2$, $P_3$, and $P_4$ as coating solution supply nozzles are arranged side by side in the X-direction (the top-to-down direction in FIG. 5). The resist solution supply nozzles $P_1$ to $P_4$ are held on corresponding nozzle holders 131, 132, 133, and 134, respectively. On the top surfaces of the nozzle holders 131 to 134, cylindrical holding pins 135, 136, 137, and 138 are formed toward the vertical direction. A later-described first arm 171 can hold the nozzle holders 131 to 134 by holding the holding pins 135 to 138.

As shown in FIG. 4, to the resist solution supply nozzle $P_1$, a resist solution supply pipe 141 is connected which communicates with a resist solution supply source 140 located outside the casing 20a. The resist solution supply pipe 141 is provided with an opening/closing valve 142 which controls the timing of supplying the resist solution. Resist solution supply pipes 141 which communicate with resist solution supply sources 140 are connected also to the resist solution supply nozzles $P_2$ to $P_4$, similarly to the resist solution supply nozzle $P_1$, and the resist solution supply pipes 141 are provided with opening/closing valves 142 respectively. The resist solution supply sources 140 corresponding to the resist solution supply nozzles $P_1$ to $P_4$ have resist solutions $R_1$, $R_2$, $R_3$, and $R_4$ stored therein which are different in kind from each other, so that the different kinds of resist solutions can be supplied from the resist solution supply nozzles $P_1$ to $P_4$. Incidentally, the resist solutions $R_1$ to $R_4$ contain coating solvents $A_1$, $A_2$, $A_3$, and $A_4$ as solvents, respectively.

As shown in FIG. 5, a nozzle accommodation unit 150 is provided, for example, on the side of the positive direction in the Y-direction (the right direction in FIG. 5) of the cup 122. In the nozzle accommodation unit 150, a plurality of, for example, four solvent supply nozzles $S_1$, $S_2$, $S_3$, and $S_4$ are arranged side by side in the X-direction (the top-to-down direction in FIG. 5). The solvent supply nozzles $S_1$ to $S_4$ are held on corresponding nozzle holders 151, 152, 153, and 154, respectively. On the top surfaces of the nozzle holders 151 to 154, cylindrical holding pins 155, 156, 157, and 158 for a later-described second arm 172 to hold the nozzle holders 151 to 154, are formed toward the vertical direction, respectively.

As shown in FIG. 4, to the solvent supply nozzle $S_1$, a solvent supply pipe 161 is connected which communicates with a solvent supply source 160 located outside the casing 20a. The solvent supply pipe 161 is provided with an opening/closing valve 162 which controls the timing of supplying the solvent. Solvent supply pipes 161 which communicate with solvent supply sources 160 are connected also to the solvent supply nozzles $S_2$ to $S_4$, similarly to the solvent supply nozzle $S_1$, and the solvent-supply pipes 161 are provided with opening/closing valves 162, respectively. The solvent supply sources 160 corresponding to the solvent supply nozzles $S_1$ to $S_4$ have removal solvents $B_1$, $B_2$, $B_3$, and $B_4$ stored therein respectively which are for edge rinse and different in solubility parameter, so that the removal solvents $B_1$ to $B_4$ different in solubility parameter can be supplied from the solvent supply nozzles $S_1$ to $S_4$.

Figure 6:
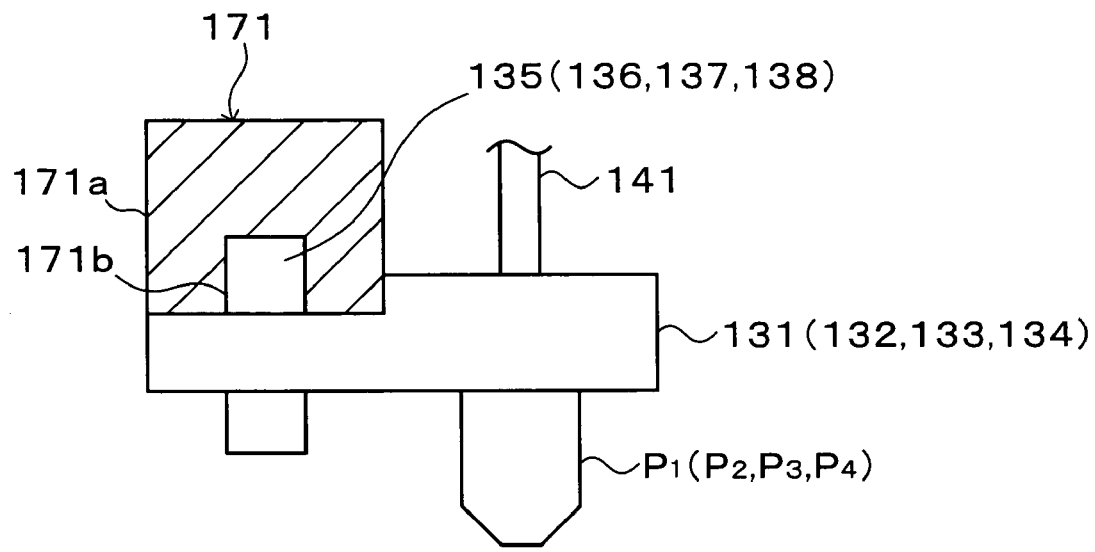
FIG. 6 is an explanatory view of a longitudinal section showing the outline of a structure of a tip portion of a first arm.

As shown in FIG. 5, on the side of the negative direction in the X-direction (the downward direction in FIG. 5) of the cup 122, for example, a rail 170 is formed which extends along the Y-direction. The rail 170 is formed, for example, from the outside on the side of the negative direction in the Y-direction of the cup 122 to the outside on the side of the positive direction in the Y-direction of the cup 122. To the rail 170, for example, two arms 171 and 172 are attached. The first arm 171 can move in the Y-direction on the rail 170 by means of, for example, an arm drive unit 174. The first arm 171 can extend and contract in the X-direction and further move in the vertical direction, for example, by means of the arm drive unit 174. As shown in FIG. 6, a tip end portion 171a of the first arm 171 has, for example, a recessed portion 171b formed at its lower surface which fits in the holding pins 135 to 138 of the nozzle holders 131 to 134. To the tip end portion 171a of the first arm 171, a not-shown locking mechanism is attached which locks the holding pins 135 to 138 inserted into the recessed portion 171b. The first arm 171 can hold each of the nozzle holders 131 to 134 by locking each of the holding pins 135 to 138 thereto. This configuration ensures that the first arm 171 can hold any of the nozzle holders 131 to 134 at the nozzle accommodation unit 130 and move the corresponding one of the resist solution supply nozzles $P_1$ to $P_4$ to a position above the central portion of the wafer W within the cup 122.

Figure 7:
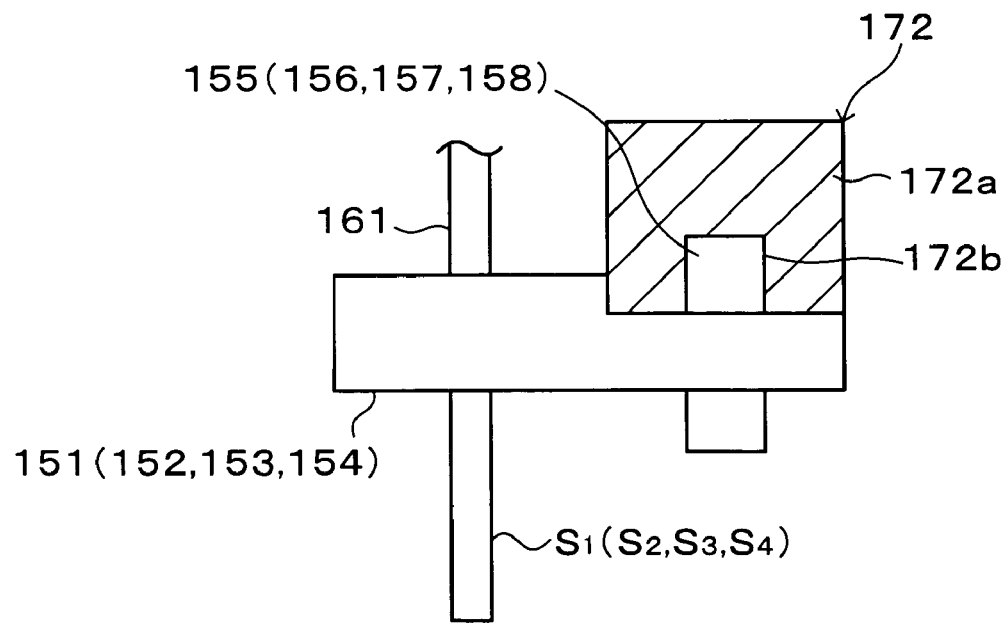
FIG. 7 is an explanatory view of a longitudinal section showing the outline of a structure of a tip portion of a second arm.

The second arm 172 can move in the Y-direction on the rail 170, similarly to the first arm 171, by means of, for example, an arm drive unit 175. The second arm 172 can extend and contract in the X-direction and further move in the vertical direction, for example, by means of the arm drive unit 175. As shown in FIG. 7, a tip end portion 172a of the second arm 172 has, for example, a recessed portion 172b formed at its lower surface which fits in the holding pins 155 to 158 of the nozzle holders 151 to 154. To the tip end portion 172a of the second arm 172, a not-shown locking mechanism is attached which locks the holding pins 155 to 158 inserted into the recessed portion 172b. The second arm 172 can hold the nozzle holders 151 to 154 by locking the holding pins 155 to 158 thereto. This configuration ensures that the second arm 172 can hold any of the nozzle holders 151 to 154 at the nozzle accommodation unit 150 and move the corresponding one of the solvent supply nozzles $S_1$ to $S_4$ to a position above the peripheral portion of the wafer W within the cup 122.

The operations of the arm drive units 174 and 175 for the first arm 171 and the second arm 172 are controlled by a unit controller 180 for the resist coating unit 20. The unit controller 180 can control the operations of the arm drive units 174 and 175 according to various settings outputted from the system controller 190 for the whole coating and developing treatment system 1.

The system controller 190 is disposed, for example, in the cassette station 2 as shown in FIG. 2. In the cassette station 2, a setting input unit 191 is provided through which setting information in the system controller 190 is manually inputted. The setting input unit 191 takes, for example, a form of a touch screen being a pointing device which can be used to input or select various kinds of setting information for the coating and developing treatment system 1 and display the setting information.

In the system controller 190, for example, correspondence data D1 between the resist solutions $R_1$ to $R_4$ to be discharged from the respective resist solution supply nozzles $P_1$ to $P_4$ and the coating solvents $A_1$ to $A_4$ contained in the respective resist solutions $R_1$ to $R_4$ as shown in FIG. 8, have been inputted. In the system controller 190, for example, SP value data D2a of the solubility parameter (SP value) of the coating solvents $A_1$ to $A_4$ as shown in FIG. 9 and SP value data D2b of the solubility parameter of the removal solvents $B_1$ to $B_4$ as shown in FIG. 10, have also been inputted. In the system controller 190, correspondence data D3 between the solvent supply nozzles $S_1$ to $S_4$ and the removal solvents $B_1$ to $B_4$ to be discharged as shown in FIG. 11 further has been inputted.

Upon selection of the kind of the resist solution according to a recipe of wafer processing, for example, the system controller 190 can, using the correspondence data D1 shown in FIG. 8, identify the coating solvent contained in that resist solution. The system controller 190 can select, through use of the SP value data D2a and D2b shown in FIG. 9 and FIG. 10, for the identified coating solvent, a removal solvent having a solubility parameter different by a predetermined value, for example, $3(J/cm^3)^{1/2}$ or more from that of the identified coating solvent. Note that when there are a plurality of removal solvents which satisfy the above condition, the system controller 190 may select for the identified coating solvent, a removal solvent having a solubility parameter most different from that of the identified coating solvent or may allow a user to select a removal solvent for use, for example, via the setting input unit 191. The system controller 190 can identify, through use of the correspondence data D3 shown in FIG. 11, the solvent supply nozzle corresponding to the above selected removal solvent. The information of the solvent supply nozzle identified by the system controller 190 is outputted to the unit controller 180 as the setting information of the solvent supply nozzle, and the unit controller 180 can control, according to the setting information, the operations of the arm drive units 174 and 175. Note that a nozzle setting unit in this embodiment is composed of, for example, the unit controller 180 and the system controller 190. A nozzle moving mechanism is composed of, for example, the rail 170, the second arm 172, and the arm drive unit 175.

Next, the process of the resist coating treatment performed in the above-described resist coating unit 20 will be described together with the process in the photolithography process performed in the coating and developing treatment system 1.

First, one wafer W is taken out of the cassette C on the cassette mounting table 5 by the wafer carrier 7 and carried to the temperature regulating unit 60 included in the third processing unit group G3. The wafer W carried to the temperature regulating unit 60 is temperature-regulated to a predetermined temperature, and is then carried by the first carrier unit 10 into the bottom coating unit 23 where the wafer is formed with an anti-reflection film. The wafer W formed with the anti-reflection film is sequentially carried by the first carrier unit 10 to the heating unit 92, the high-temperature thermal processing unit 65, and the high-precision temperature regulating unit 70 so that predetermined processing is performed in each of the units. Thereafter, the wafer W is subjected to a resist coating treatment in the resist coating unit 20. In the resist coating unit 20, the resist coating solution is applied to the front surface of the wafer W and then subjected to edge rinse.

The wafer W, for which the resist coating treatment has been completed, is carried by the first carrier unit 10 to the pre-baking unit 71 and subsequently carried by the second carrier unit 11 to the edge exposure unit 94 and the high-precision temperature regulating unit 83 so that the wafer W is subjected to predetermined processing in each of the units. Thereafter, the wafer W is carried by the wafer carrier 101 in the interface section 4 to the not-shown aligner. In this aligner, the resist film on the wafer W is exposed to light under a predetermined pattern. The wafer W for which exposure processing has been finished is carried by the wafer carrier 101, for example, to the post-exposure baking unit 84 where the wafer W is subjected to heat-processing, and is then carried by the second carrier unit 11 to the high-precision temperature regulating unit 81 where the wafer W is temperature-regulated.

The wafer W is then carried to the developing treatment unit 30 where the resist film on the wafer W is developed. The wafer W for which developing treatment has been finished is then carried, for example, by the second carrier unit 11 to the post-baking unit 75 where the wafer W is subjected to heat-processing, and is then carried to the high-precision temperature regulating unit 63 where the wafer W is temperature-regulated. The wafer W is then carried by the first carrier unit 10 to the transition unit 61 and returned by the wafer carrier 7 to the cassette C, thus completing a series of photolithography processes in the coating and developing treatment system 1.

The setting of the solvent supply nozzle to be used at the time of the edge rinse in the above-described resist coating unit 20 will be described now. First, for example, the user selects, in accordance with a treatment recipe, a resist solution from among the resist solutions $R_1$ to $R_4$ which have been already inputted in the system controller 190. For example, when the user selects the resist solution $R_2$, the system controller 190 identifies, according to the correspondence data D1 shown in FIG. 8, the coating solvent $A_2$ contained in the resist solution $R_2$. Then, the system controller 190 selects, according to the SP value data D2a and D2b shown in FIG. 9 and FIG. 10, for the coating solvent $A_2$, a removal solvent having a solubility parameter satisfying the predetermined condition, that is, the removal solvent $B_1$ having the solubility parameter different by $3(J/cm^3)^{1/2}$ or more from that of the coating solvent $A_2$.

Then, the system controller 190 identifies, according to the correspondence data D3 shown in FIG. 11, the solvent supply nozzle $S_1$ corresponding to the removal solvent $B_1$. After the identification of the solvent supply nozzle, the setting information is outputted from the system controller 190 to the unit controller 180, so that the unit controller 180 sets the solvent supply nozzle $S_2$ as the nozzle to be used at the time of edge rinse.

Next, the resist coating treatment in the resist coating unit 20 will be described. When the wafer W is carried into resist coating unit 20 and held on the spin chuck 120 as shown in FIG. 4, first of all, the first arm 171 holds the nozzle holder 132 holding the resist solution supply nozzle $P_2$ resting in the nozzle accommodation unit 130 and moves along the rail 170 to the position above the central portion of the wafer W as shown in FIG. 5. This allows the resist solution supply nozzle $P_2$ held on the nozzle holder 132 to be placed at the position above the central portion of the wafer W.

Subsequently, the wafer W is rotated by the spin chuck 120, and a predetermined amount of the resist solution $R_2$ is discharged onto the central portion of the rotated wafer W from the resist solution supply nozzle $P_2$. The resist solution $R_2$ discharged on the wafer W is diffused by centrifugal force and thereby applied over the entire front surface of the wafer W. Thereafter, the rotation of the wafer W is kept for a predetermined period to scatter an excess resist solution $R_2$ on the front surface of the wafer, resulting in formation of a solution film of the resist solution $R_2$ having a predetermined thickness on the wafer W.

After finish of the discharge of the predetermined amount of resist solution $R_2$ onto the central portion of the wafer W, the resist solution supply nozzle $P_2$ is returned by the first arm 1.71 to the nozzle accommodation unit 130. After the resist solution supply nozzle $P_2$ is accommodated in the nozzle accommodation unit 130, the second arm 172 selects the nozzle holder 151 for the set solvent supply nozzle SI from among the nozzle holders 151 to 154 resting in the nozzle accommodation unit 150 and holds it. The solvent supply nozzle $S_1$ is moved by the second arm 172 to the position above the peripheral portion of the wafer W on the negative direction side in the Y-direction as shown in FIG. 5.

Figures 12, 13:
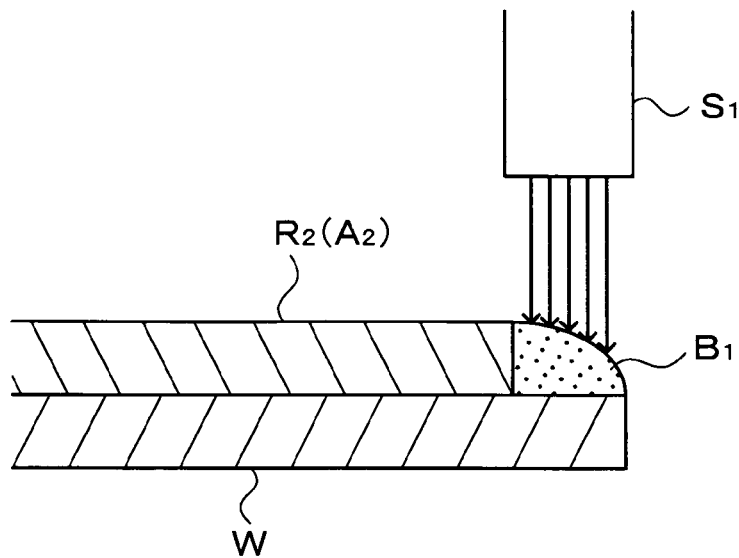
FIG. 12 is a longitudinal sectional view showing a state in which the removal solvent is being supplied onto a peripheral portion of a wafer.
FIG. 13 is an explanatory diagram showing combination data showing whether the combination between the coating solvent and the removal solvent is appropriate or not.

Then, immediately after the formation of the solution film of the resist solution $R_2$ in a predetermined thickness on the wafer W, that is, before the resist solution $R_2$ dries completely, edge rinse is started in which the removal solvent $B_1$ is discharged from the solvent supply nozzle $S_1$ to the peripheral portion of the wafer W as shown in FIG. 12 with the wafer continuously kept rotated. The discharge of the removal solvent $B_1$ removes the resist solution $R_2$ on the peripheral portion of the wafer W in an annular shape with a predetermined width. In this event, since the solubility parameter of the coating solvent $A_2$ in the resist solution $R_2$ on the front surface of the wafer is different from the solubility parameter of the removal solvent $B_1$ supplied onto the peripheral portion of the wafer W, the removal solvent $B_1$ on the peripheral portion of the wafer W and the resist solution $R_2$ adjacent thereto repel and never mix with each other. This removes only the resist solution $R_2$ on the peripheral portion of the wafer W by the removal solvent $B_2$. During the removal of the resist solution $R_2$ on the peripheral portion of the wafer W, the solution film of the resist solution $R_2$ on the inner side of the wafer peripheral portion dries.

After the resist solution $R_2$ on the peripheral portion of the wafer W is removed, the rotation of the wafer W is stopped, and the supply of the removal solvent $B_1$ from the solvent supply nozzle $S_1$ is stopped. Then, the solvent supply nozzle $S_1$ is returned by the second arm 172 to the nozzle accommodation unit 150. Thereafter, the wafer W on the spin chuck 120 is carried out by the first carrier unit 10 from the resist coating unit 20, with which a series of resist coating treatments is completed.

According to the above embodiment, depending on the coating solvent contained in the resist solution to be applied, a removal solvent having a solubility parameter different from that of the coating solvent can be selected, so that the resist solution containing the coating solvent repels the removal solvent during the edge rinse. Therefore, the edge rinse can be started before the resist solution applied on the wafer W dries completely, so that only the resist solution on the peripheral portion of the wafer W can be appropriately removed. As a result of this, the total resist coating treatment period including the edge rinse can be reduced.

According to the above embodiment, the resist coating unit 20 includes the nozzle setting unit for the solvent supply nozzle, so that even if the resist solution is changed, an appropriate solvent supply nozzle can be automatically set at each change.

In the above-described embodiment, the SP value data $D2a$ showing the solubility parameters of the coating solvents $A_1$ to $A_4$ and the SP value data $D2b$ showing the solubility parameters of the removal solvents $B_1$ to $B_4$ have been inputted in the system controller 190. Combination data D4, as shown in Table of FIG. 13, showing, from among combinations between the coating solvents $A_1$ to $A_4$ and the removal solvents $B_1$ to $B_4$, combinations in which the solubility parameters of the solvents differ by a set value or more (○ mark in Table) and combinations in which the solubility parameters of the solvents differ by less than the set value (X mark in Table) may have been inputted in the system controller 190. Also in this case, upon identification of the coating solvent, a removal solvent suitable for the coating solvent can be selected and set based on the solubility parameter.

One embodiment of the present invention has been described. The present invention is not limited to this embodiment but may take various forms. For example, four resist solution supply nozzles $P_1$ to $P_4$ and four solvent supply nozzles $S_1$ to $S_4$ are provided in the resist coating unit 20 in the above-described embodiment, but the number of each kind of the nozzles is not limited to four. Any number can be set.

Further, although the resist coating unit 20 for applying the resist solution onto the wafer W has been described in the above embodiment, the present invention is also applicable to a coating treatment apparatus for applying a coating solution other than the resist solution to the wafer W, for example, a coating solution for forming an SOD, SOG (Spin on Glass) film, or the like. Further, the present invention is also applicable to a case of applying the coating solution to substrates other than the wafer such as an FPD (Flat Panel Display), a mask reticule for a photomask, and so on.

The present invention is useful to reduce the coating treatment period for applying the coating solution onto the substrate and performing edge rinse.

What is claimed is:

1. A coating treatment apparatus for applying a coating solution to a front surface of a substrate, comprising:
   a plurality of coating solution supply nozzles, one coating supply nozzle for applying a different coating solution containing a solvent from a coating solution of another of said plurality of coating solution supply nozzles onto the front surface of the substrate;
   a plurality of solvent supply nozzles, one solvent supply nozzle for supplying a different removal solvent having a different solubility parameter from the solubility parameter of a removal solvent of another solvent supply nozzle a peripheral portion of the substrate, at the time of edge rinse to remove the coating solution on the peripheral portion of the substrate; and a system controller programmed to identify the one solvent supply nozzle for use at the time of the edge rinse from among said plurality of solvent supply nozzles, based on the solubility parameter of the solvent in the coating solution to be applied by said one coating supply nozzle and on the solubility parameter of the removal solvent to be supplied from said one solvent supply nozzle, and said apparatus further comprising a nozzle setting unit for setting one of said plurality of a solvent supply nozzles for use at the time of the edge rinse from among said plurality of solvent supply nozzles, based on the information of said one solvent supply nozzle identified by said system controller.

2. The coating treatment apparatus as set forth in claim 1, wherein said nozzle setting unit sets said identified one solvent supply nozzle for use at the time of edge rinse such that the solubility parameter of the solvent in the coating solution to be applied from said coating solution supply nozzle is different by a predetermined set value or more from the solubility parameter of the solvent to be supplied from said identified one solvent supply nozzle.

3. The coating treatment apparatus as set forth in claim 2, wherein the set value is $3(J/cm^3)^{1/2}$.

4. The coating treatment apparatus as set forth in claim 1, further comprising:

a nozzle moving mechanism for selectively holding said identified one solvent supply nozzle set by said nozzle setting unit from among said plurality of solvent supply nozzles, and for moving said selectively held solvent supply nozzle to a position above the peripheral portion of the substrate.

5. The coating apparatus as set forth in claim 1, further comprising said plurality of coating solution supply nozzles for supplying different kinds of coating solutions.

6. The coating apparatus as set forth in claim 1, wherein data of the solubility parameter of the solvent in the coating solution to be applied from said one coating solution supply nozzle and data of the solubility parameter of the solvent to be supplied from said solvent supply nozzle, have been previously inputted in said nozzle setting unit.

7. The coating treatment apparatus as set forth in claim 6, wherein a combination between the solvent in the coating solution and the solvent to be supplied from said one solvent supply nozzle, the solvents having solubility parameters different by a predetermined set value or more from each other, has been further inputted in said nozzle setting unit.

8. The coating treatment apparatus as set forth in claim 1, wherein said system controller has an associated table comprising solubility parameter values input for each coating solution.

9. The coating treatment apparatus as set forth in claim 8, wherein said system controller has a table associating one of a plurality of coating solvents to an associated one coating solution supply nozzle of said plurality of coating solution supply nozzles.

10. The coating treatment apparatus as set forth in claim 1, wherein said system controller has an associated table comprising solubility parameter values input for each removal solvent.

11. The coating treatment apparatus as set forth in claim 10, wherein said system controller has a table associating one of a plurality of removal solvents to an associated one solvent supply nozzle of said plurality of solvent supply nozzles.

* * * * *